United States Patent
Schamber et al.

(10) Patent No.: US 10,712,386 B2
(45) Date of Patent: Jul. 14, 2020

(54) DEVICE AND METHOD FOR DATA PRESERVATION AND POWER LOSS RECOVERY IN AN ELECTRIC METER

(71) Applicant: Landis+Gyr LLC, Lafayette, IN (US)

(72) Inventors: David Schamber, Lafayette, IN (US); David Bobick, West Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 124 days.

(21) Appl. No.: 15/976,190

(22) Filed: May 10, 2018

(65) Prior Publication Data

US 2019/0346506 A1    Nov. 14, 2019

(51) Int. Cl.
| | |
|---|---|
| *G06F 11/00* | (2006.01) |
| *G01R 31/317* | (2006.01) |
| *G01R 21/133* | (2006.01) |
| *G06Q 50/06* | (2012.01) |

(52) U.S. Cl.
CPC ..... *G01R 31/31726* (2013.01); *G01R 21/133* (2013.01); *G06Q 50/06* (2013.01)

(58) Field of Classification Search
CPC ............ G06F 11/1402; G06F 11/1458; G06F 11/2069; G05B 11/01; G05B 23/0202
See application file for complete search history.

(56) References Cited

U.S. PATENT DOCUMENTS

| | | | | |
|---|---|---|---|---|
| 4,627,000 A | * | 12/1986 | Germer | G01R 21/00 324/103 R |
| 4,987,363 A | * | 1/1991 | Gibbs | G01R 21/1333 324/142 |
| 5,079,715 A | | 1/1992 | Venkataraman et al. | |
| 5,181,231 A | * | 1/1993 | Parikh | H03K 21/403 377/24.1 |
| 6,262,672 B1 | * | 7/2001 | Brooksby | G01D 4/004 340/870.05 |
| 2002/0036492 A1 | * | 3/2002 | Slater | G01R 21/133 324/142 |
| 2005/0036387 A1 | * | 2/2005 | Seal | G11C 16/102 365/222 |

(Continued)

FOREIGN PATENT DOCUMENTS

WO    1985/04725    10/1985

OTHER PUBLICATIONS

PCT Patent Application No. PCT/US2019/031032, International Search Report and Written Opinion, dated Sep. 12, 2019, 11 pages.

*Primary Examiner* — Christopher S McCarthy
(74) *Attorney, Agent, or Firm* — Kilpatrick Townsend & Stockton LLP

(57) ABSTRACT

An electric meter that is configured to regenerate meter state data after a power loss includes a memory with at least one volatile and non-volatile memory device and a processor connected to the memory. The processor is configured to retrieve a backup copy of meter state data and a plurality of meter input data samples that were generated after the backup copy of the meter state data and prior to the power loss from a non-volatile memory device. The processor is configured to regenerate meter state data by updating the backup copy of meter state data with the plurality of meter input data samples to regenerate the meter state data at the time of a final meter input data sample prior to the power loss.

19 Claims, 4 Drawing Sheets

(56) References Cited

U.S. PATENT DOCUMENTS

| | | | |
|---|---|---|---|
| 2006/0217936 A1* | 9/2006 | Mason | G01D 4/004 702/188 |
| 2013/0018843 A1* | 1/2013 | Bultman | G06F 17/00 707/609 |
| 2013/0241532 A1 | 9/2013 | Schamber et al. | |

* cited by examiner

DEVICE AND METHOD FOR DATA PRESERVATION AND POWER LOSS RECOVERY IN AN ELECTRIC METER

TECHNICAL FIELD

This disclosure relates to electric meters generally and, more particularly, to electric meters that minimize data loss in the event of a power failure without requiring the use of an uninterruptable power supply.

BACKGROUND

Electricity meters are devices that measure and/or meter aspects of energy provided to a load. The load may be a residence, business, or even part of a larger electricity distribution system. Commonly available meters include electromechanical meters and electronic meters. Electromechanical meters employ a rotating disk that rotates in response to electric and magnetic fields induced by the electricity passing to the load. As is known in the art, the disk rotation speed is a function of the amount of electricity delivered to the load. Mechanical counters accumulate the number of disk rotations, which is indicative of energy consumed by the load. In some cases, an electromechanical meter can employ processing circuitry to perform additional operations with the consumption information provided by the rotating disk.

Electronic meters typically employ processing circuitry instead of the rotating disk and mechanical counters. In such meters, sensors within the meter detect the voltage and current that is delivered to the load. Circuitry within the meter converts the sensed voltage and current into digital values. Processing circuitry then employs digital signal processing to calculate consumed energy, among other things, from the digital values. Electronic meters provide greater flexibility in the types of energy consumption information that they may calculate, track, and store.

An electric meter that measures the electrical power flow through a power line typically uses a small portion of the electric power that flows through the line to provide electrical power to the circuits, processors, and other components within the electric meter itself. Of course, in some situations the flow of electricity to the electric meter is interrupted due to a power outage. Some simple electric meters, such as electromechanical disk meters, cease operation when the electric power supply is interrupted and resume operation upon restoration of electric power. However, more sophisticated electric meters generate measurements and billing data based on measurements of the electrical power over longer periods of time, and a loss of electrical power means that the electric meter loses a significant amount of data. More sophisticated prior art electric meters use a form of uninterruptable power supply (UPS) with an independent energy store such as a battery or large capacitors (sometimes referred to as "supercapacitors") that enables the electric meter to either maintain operation during a short interruption in electrical power through the power line or, in the case of longer interruptions, to transmit information stored in the memory of the electric meter to an external monitoring system prior to exhaustion of the energy store in the UPS.

While prior-art UPS implementations reduce the likelihood of data loss in an electric meter due to unexpected losses of electrical power, these devices add to the cost and complexity of the electric meter while simultaneously increasing the electrical energy consumption of the electric meter and potentially reducing the reliability of the electric meter. In some situations, the potential for a failure of the battery or other component in the UPS can actually increase the likelihood that the electric meter will experience a failure and be unable to monitor an electric line, which is actually counterproductive since the underlying reason to include the UPS is to improve the reliability of the electric meter. Consequently, improvements to electric meters that mitigate the effects of power loss without requiring prior-art UPS implementations would be beneficial.

SUMMARY

In one embodiment, an electric meter that is configured to regenerate meter state data after a power loss has been developed. The electric meter includes a memory, the memory storing at least one volatile memory device and at least one non-volatile memory device; and a processor operatively connected to the memory. The processor is configured to retrieve a backup copy of meter state data from the at least one non-volatile memory device after the electric meter resumes operation following a power loss, retrieve a plurality of meter input data samples from the at least one non-volatile memory device after the electric meter resumes operation following the power loss, the plurality of meter input data samples being associated with a time period after the backup copy of meter state data was stored in the at least one non-volatile memory device and prior to the power loss, and regenerate meter state data by updating the backup copy of meter state data with the plurality of meter input data samples to regenerate the meter state data at the time of a final meter input data sample in the plurality of meter input data samples prior to the power loss, the meter state data being stored in the at least one volatile memory device.

In another embodiment, a method of operating an electric meter that an electric to regenerate meter state data after a power loss has been developed. The method includes, retrieving, with a processor in the electric meter, a backup copy of meter state data from at least one non-volatile memory device in the electric meter after the electric meter resumes operation following a power loss, retrieving, with the processor, a first plurality of meter input data samples from the at least one non-volatile memory device after the electric meter resumes operation following the power loss, the first plurality of meter input data samples being associated with a time period after the backup copy of meter state data was stored in the at least one non-volatile memory device and prior to the power loss, and regenerating, with the processor, meter state data by updating the backup copy of meter state data with the first plurality of meter input data samples to regenerate the meter state data at a time of a final meter input data sample in the first plurality of meter input data samples prior to the power loss, the meter state data being stored in at least one volatile memory device in the electric meter.

BRIEF DESCRIPTION OF THE DRAWINGS

The foregoing aspects and other features of an electric meter are explained in the following description, taken in connection with the accompanying drawings.

DETAILED DESCRIPTION

Figure 1:
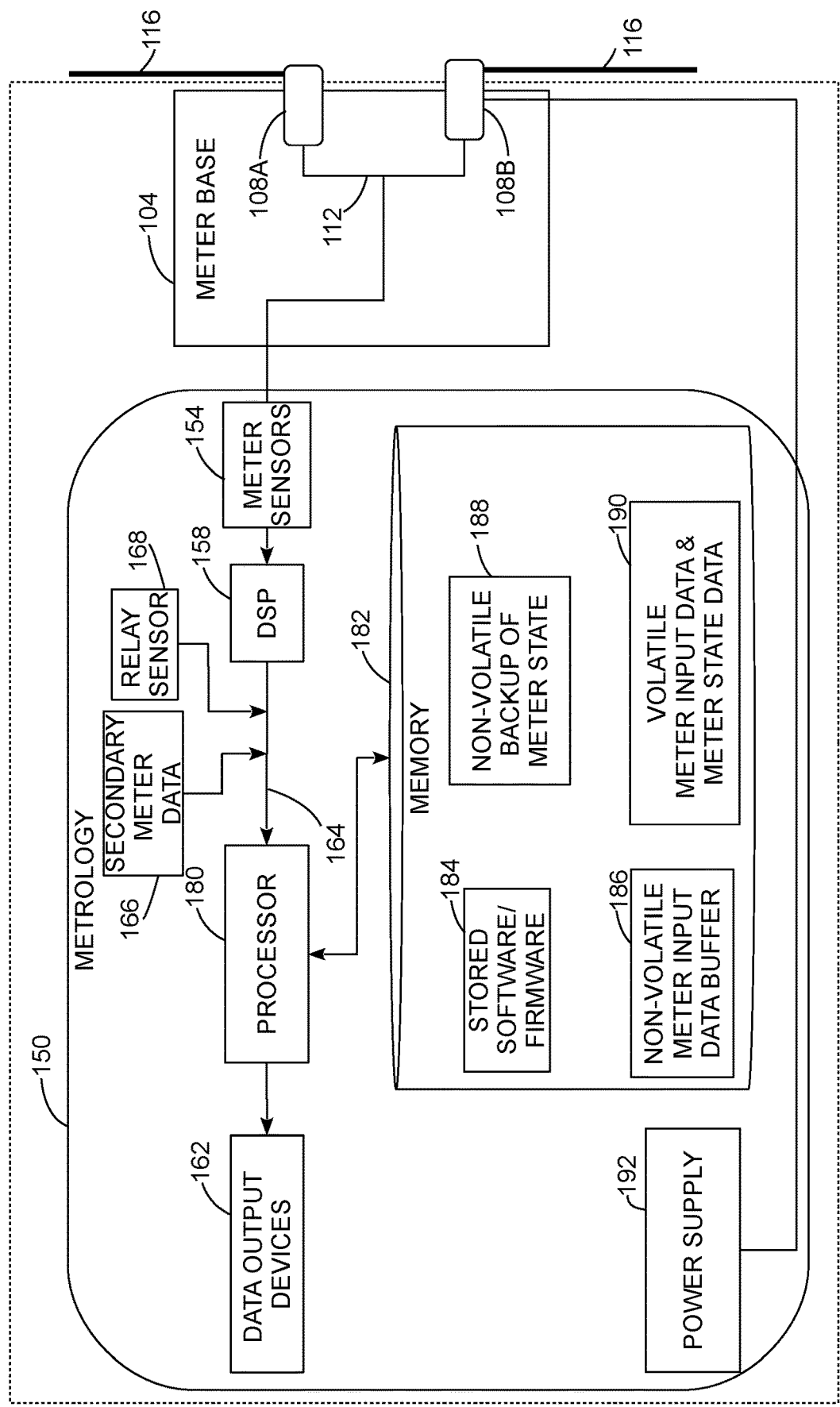
FIG. 1 is a schematic diagram of an electric meter that is configured to handle interruption of service conditions without loss of measurement data and without requiring an uninterruptable power supply.

For a general understanding of the environment for the device disclosed herein as well as the details for the device, reference is made to the drawings. In the drawings, like reference numerals designate like elements.

As used herein, the term "metrology circuit" refers to any suitable circuit that detects, measures, and determines one or more electricity and/or electrical energy consumption values based on energy flowing between terminals of an electric meter that are connected in-line with a power line between an electric power source and the load that receives the electric power. In one common configuration, an electrical grid or other generation source is connected to one set of terminals and the load that receives the electrical power is connected to the other set of terminals. The electric power in the power line flows through the electric meter and the metrology circuit measures various aspects of the electrical signal including, but not necessarily limited to, voltage and current.

As used herein, the term "meter input data" refers to any digital information that a processor in an electric meter receives from sensors in the electric meter, other devices in the meter, or from other electric meters via a network devices and records to a non-volatile memory device to maintain a record of the meter input data in the event of a power loss. One form of meter input data is meter sensor data (also referred to as "sensor data"), which include raw or processed information from electrical current and voltage sensors and optionally other sensors in the electric meter. Another form of meter input data includes relay state information that records the status of one or more electrical relays that are included in or are connected to the electric meter. Another form of meter input data includes meter input data that are received from other electric meters that are connected via a data network in configurations where a single electric meter stores meter input data for multiple electric meters.

As used herein, the term "meter state data" refers to state information that one or more processors in the electric meter generates by performing further processing of one or more samples of the meter input data that are recorded over time. Examples of meter state data include, for example, billing record data that are generated at least in part based on the measured energy consumption level that is determined based on meter sensor data and other meter input data. Other examples of meter state data include alarms and records of other events of interest that the meter records based on the input data. In the illustrative embodiments described herein, the meter state data are stored in tabular data structures that include fields to store billing register data, including time-of-use data. The meter state data further include load profile interval data, primary and secondary recorders, daily maximum/minimum demand data, pending dial-out causes, and internal data structures that support the above data. In particular, the pending dial-out causes refer to alarms and other events of interest that the electric meter has detected but has not yet transmitted to an external monitoring system using a modem or other data networking device.

Some electric meter embodiments optionally store meter state data in data tables that conform to the ANSI C12.19 standard. A non-limiting list of these tables from the ANSI C12.19 standard includes: Table 23—Current Register Data Table, Table 24—Previous Season Data Table, Table 25—Previous Demand Reset Data Table, Table 26—Self-read Data Table, Table 63—Load Profile Status Table, Table 64-67—Load Profile Data Set One/Two/Three/Four Tables, Table 74—History Log Data Table, Table 76—Event Log Data Table. While tables from the ANSI C12.19 standard are described in conjunction with the meter state data for illustrative purposes, an electric meter can store the meter state data in another format that need not comply with the ANSI C12.19 standard.

FIG. 1 depicts an electric meter 100 that includes a meter base 104 and a metrology circuit 150. While FIG. 1 depicts the meter base 104 and metrology circuit 150 as separate components, in some embodiments the meter base 104 and metrology circuit 150 are combined into a single printed circuit board or other substrate. The illustrative embodiment of the electric meter 100 of FIG. 1 depicts the components that are necessary to implement the power loss recovery operations described herein and do not necessarily depict each and every component of an electric meter in great detail, and any omission of a specific electric meter component from the description is not exclusionary unless expressly noted as such herein.

In the electric meter 100, the meter base 104 includes two terminals 108A and 108B that are connected together via a conductor 112. The terminals 108A and 108B extend from a housing of the electric meter 100 to engage a socket that is formed in the power line 116 to place the conductor 112 in series with the power line 116. The meter base 104 of FIG. 1 depicts a single power line 116 and a single set of terminals 108A and 108B for illustrative purposes, but other electric meter embodiments include additional sets of terminals to monitor multiple power lines in, for example, a multi-phase power line system. While not expressly depicted in FIG. 1, the meter base 104 optionally includes additional analog or digital sensor components that enable the components of the metrology circuit 150 to monitor the flow of electric power through the power line 116 and the conductor 112. Examples of additional components that are incorporated into the meter base include, but are not limited to, inductive coils and magnets used in various embodiments of current sensors, resistors for voltage dividers used for measuring voltage levels in the power line 116, and isolation elements that prevent high voltage or high current electricity from affecting components in the metrology circuit 150.

In some embodiments, the meter base 104 or other structures within the meter include signal controls that operate external relays, such as solid state or electromechanical relays, which are operative to connect and disconnect individual loads or groups of loads to the conductor 112 and power line 116. The relays are used in power load shedding operations in which some embodiments of the electric meter 100 operate the relays to disconnect appliances and other energy consuming devices that are connected to the power line 116 via the relays individually to reduce the total level of power consumption during peak demand periods. Information about the states of the relays (opened to disconnect power to the load or closed to connect power to the load) is encoded as relay sensor data that forms part of the meter input data in the electric meter 100, and load shedding is otherwise generally known to the art and is not discussed in further detail herein.

Another use of relay sensor data in an electric meter refers to KYZ pulses that a relay generates whenever the electric meter measures a predetermined amount of electrical energy consumption (e.g. 1 pulse=1 KWh of consumption although other configurations generate pulses for different amounts of energy). As known in the art, the KYZ pulses are produced when two relays (Y and Z) that are connected to a common line K switch between opposing closed and opened configurations, such as ($Y_{open} \rightarrow Y_{closed}$, $Z_{closed} \rightarrow Z_{open}$) or ($Y_{closed} \rightarrow Y_{open}$, $Z_{open} \rightarrow Z_{closed}$). The relays perform the alternating switching operation after the load consumes the predetermined amount of energy, and the length of time for the pulse from the closed relay indicates the amount of time that the load took to consume the predetermined amount of energy. In the electric meter 100, the duration of each pulse is approximately one second when the load draws a maximum expected power level, although transient spikes in the load power consumption can produce shorter pulses during brief periods. Different embodiments of the electric meter 100 record the pulses corresponding to the relay states of the Y and Z relays as part of the process for recording meter input data in addition to or instead of data that are received from the DSP 158.

In the electric meter 100, the metrology circuit 150 includes one or more electric meter sensors 154, a digital signal processor (DSP) 158, one or more data output devices 162, a data input bus 164, secondary meter network device 166, relay sensors 168, a processor 180, a memory 182, and a power supply 192. The electric meter sensors 154 in the embodiment of FIG. 1 include at least one current sensor and voltage sensor. The current sensor detects the electrical current level in the power line 116 and the voltage sensor detects the voltage level in the power line 116 relative to a ground wire in the power line 116 or another ground reference. In the electric meter 100, the electric meter sensors 154 are coupled to the conductor 112 in the meter base 104 to sense the electric current and voltage levels that flow through the power line 116 and conductor 112. The electric meter sensors 154 optionally include other sensors including, for example, zero crossing sensors, arc detection circuits, temperature sensors, and the like.

The DSP 158 in the metrology circuit 150 is connected to the meter sensors 154 and generates a set of data output elements based on the sensor data at regular intervals. In some embodiments the DSP 158 includes analog to digital circuits that convert analog sensor signals from the sensors 154 into digital form for additional processing in the DSP 158 and the processor 180. The DSP 158 receives the sensor data from the meter sensors 154 at a high rate, such as a rate of several hundred hertz or several kilohertz. The DSP 158 optionally applies filters and other signal processing techniques to remove noise from the sensor data, and generates a digitized meter sensor data sample that integrates the measurements of electrical current and voltage signals over a predetermined time period, such as a one second interval although longer or shorter intervals may be used. Examples of meter sensor data that the DSP 158 generates include, but are not limited to, aggregate electrical current and voltage levels (including RMS current/voltage or $I^2/V^2$ measurements), voltage distortion measurement, Volts-Ampere (VA), phase angle measurements, a measurement of the hourly energy consumption rate of the power line prorated over the one second period, power factor ratio values, and other suitable meter sensor data. Different embodiments of the DSP 158 can also generate meter sensor data samples from other sensors in the electric meter 100 including, for example, temperature sensors, magnetic sensors, and any other suitable sensor device.

The data output devices 162 in the metrology circuit 150 are devices that provide output monitoring data generated in the electric meter 100 to either or both of an external monitoring system via a data transmission device, and to human readable output devices such as gauges, indicator lights, display screens, and audible alarms. In one embodiment the data output devices 162 include a data transmission device such as a modem, wireless transmitter, USB or serial port, or a wired network adapter such as Ethernet or Power Line networking that transmits collected meter data to an external computing device for storage and further analysis. In some embodiments the external computing device is part of an electric grid monitoring system that is operated by an electric utility. In another embodiment, the data output devices 162 provide human-readable outputs at the location of the electric meter 100. During operation of the electric meter a networked data output device 162 typically transmits meter state data and optionally transmits meter input data to a remote monitoring system at comparatively long time intervals, such as one hour intervals.

In the metrology circuit 150, an input data bus 164 connects the DSP 158, secondary meter network device 166, and relay sensors 168 to the processor 180. The input data bus 164 is, for example, a shared digital data bus implemented using a shared or point-to-point wired connection using any suitable data exchange protocol that enables the processor 180 to receive meter input data from each of the DSP 158, secondary meter network device 166, and relay sensor 168. In particular, the secondary meter network device 166 is a wired or wireless network data transceiver that optionally connects the electric meter 100 to one or more additional electric meters to enable the electric meter 100 to receive additional meter input data from other electric meters, which are referred to as secondary electric meters. Some electric power monitoring systems use groups of multiple meters in which one meter in the group receives and records meter input data from the other meters in the group. In some embodiments the network data transceiver that implements the secondary meter network device 166 is also used as a data output device 162, with one functional difference being that the secondary meter network device 166 communicates with other electric meters while the output device 162 communicates with an external monitoring system.

The relay sensors 168 detect transitions between the opened and closed states of relays (if any) in the electric meter 100 and generate meter input data that indicate the transition between the opened and closed states for particular relays for the processor 180. The relay sensors 168 include, for example, electrical continuity circuits that determine if a relay is in the opened or closed state and an output circuit that transmits digital data to the processor 180 to indicate a transition in the state of the relay and to identify the relay in embodiments of the electric meter 100 that include more than one relay. The processor 180 uses the relay state information to monitor the opened or closed states of the relays that provide load-shedding functionality over time and, in embodiments that monitor KYZ pulses, to measure energy usage of the load based on the duration of each pulse from the Y and Z relays. In some embodiments, the processor 180 also controls the load shedding relays although in other embodiments an external control device controls the state of the relays independently of the processor 180. The electric meter 100 includes a separate control circuit (not shown) that enables the processor 180 to operate the relays to place each relay in an opened or closed state in a load-shedding operation.

In the metrology circuit 150, the processor 180 is operatively connected to the DSP 158, data output devices 162, a secondary meter network device 166, relay sensors 168, and the memory 182. The processor 180 in the metrology circuit 150 is a digital logic device that includes, for example, one or more microprocessors, microcontrollers, field programmable gate arrays (FPGAs), programmable logic controllers (PLCs), application specific integrated circuits (ASICs), and the like. The processor 180 also includes a real time clock (RTC) that provides time data with sufficient accuracy and precision for accurate measurement of the time of electrical power consumption, such as an RTC that is accurate and precise to one second in the embodiment of FIG. 1. When properly synchronized with an external time source, the RTC enables the processor 180 to record the time at which various samples of meter input data are received, which is useful for a number of applications including systems that monitor a large number of electric meters in a power grid or other distributed system. While FIG. 1 depicts the RTC as being integrated with the processor 180, in alternative embodiments the RTC is a separate device that is connected to the processor 180. While FIG. 1 depicts the electric meter 100 in which the DSP 158 is a separate device from the processor 180, in some embodiments the DSP 158 is integrated with the processor 180. In addition to the specific functions described herein, the processor 180 also performs metrology routines, display routines, communication routines, that are commonly associated with the operation of electric meters.

In the electric meter 100, the memory 182 includes at least one volatile memory device and at least one non-volatile memory device. The terms "volatile" and "non-volatile" are ascribed their ordinary meaning to those of skill in the art. More particularly, a volatile memory device is a memory device that reliably retains data only when provided with electrical power and loses the data rapidly in the event of an electrical power loss. Embodiments of volatile memory suitable for use in the electric meter 100 include, but are not limited to, static and dynamic random access memory (SRAM and DRAM) devices. Volatile memory devices also include memory caches that are incorporated into some embodiments of the processor 180. A non-volatile memory device uses electrical power to read and write stored data, but the non-volatile memory device can retain the stored data for long periods of time in the absence of electrical power. Embodiments of non-volatile memory that are suitable for use in the electric meter 100 include, but are not limited to, solid state memory devices including, for example, EEPROMs, NAND and NOR flash, phase-change solid state memory devices, and the like.

In the memory 182, one or more non-volatile memory devices hold the stored software/firmware instruction code 184, a data buffer of meter input data 186, and a periodic backup of two or more copies of the meter state data 188. The processor 180 uses the stored software/firmware data 184 to execute operations in the electric meter 100 and perform the functions described herein. As described in more detail below, the processor 180 stores the meter input data received from the DSP 158, secondary meter network device 166, and relay sensors 168, in the non-volatile meter input data buffer 186 for a limited period of time (e.g. 30 minutes of sensor data samples) and periodically makes a backup storage of the meter state data 188 in non-volatile memory to enable the electric meter to recover from a loss of electrical power with minimal loss of data. The memory 182 also includes one or more volatile memory devices 190 that store and process the meter sensor data received from the DSP 158, other sources of meter input data, and the meter state data.

In the electric meter 100 the power supply 192 is a switched capacitor power supply device or other suitable power supply device that is connected to the power line 116 via the conductor 112 and terminals 108A/108B. The power supply 192 converts an alternating current (AC) electrical signal in the power line 116 to a direct current (DC) output at one or more predetermined supply voltage levels (e.g. 12V, 5V, 3.3V, etc.) to supply electrical power to the meter sensors 154, DSP 158, data output devices 162, processor 180, the memory 182, and other components that consume DC electrical power in the electric meter 100. While the electric meter 100 measures AC power in the power line 116, another electric meter embodiment that measures a DC power line employs a DC-to-DC power supply to convert a DC electrical current in the power line to suitable voltage and current levels for use in the electrical meter 100. In either embodiment, the power supply 192 only supplies power to the components in the electrical meter when electrical power is available from the power line 116.

The electric meter 100 does not require an uninterruptable power supply (UPS) to minimize the loss of measurement data and meter state data that occurs in the event of a power loss from the power line 116, which is often caused by a power outage from an electrical power source that supplies electrical power to the power line 116 but may occur due to disconnection of the electric meter 116 from the power line 116 or due to a failure the power supply 192 or another component within the electric meter 100. Instead, as is described in more detail below, the electric meter 100 is configured to store meter input data to a non-volatile memory at substantially the same rate at which the input meter data samples are generated (e.g. once a second) to prevent any substantial loss (e.g. more than one second) of recorded meter input data and to regenerate the meter state data of the electric meter using the recorded meter input data. Additionally, the electric meter 100 does not require a battery or capacitor to maintain the state of a real time clock in the event of electrical power loss. While the electric meter 100 does not require a UPS, another embodiment of the electric meter 100 can be configured to use a UPS without preventing operation of the processes described herein that enable the electric meter 100 to recover from an unexpected power loss. For example, another embodiment of an electric meter that includes a UPS could still be subject to an unexpected power loss due a failure of components in the UPS itself, and the electric meter implements the structure and methods described herein to recover from the unexpected power loss.

Figure 2:
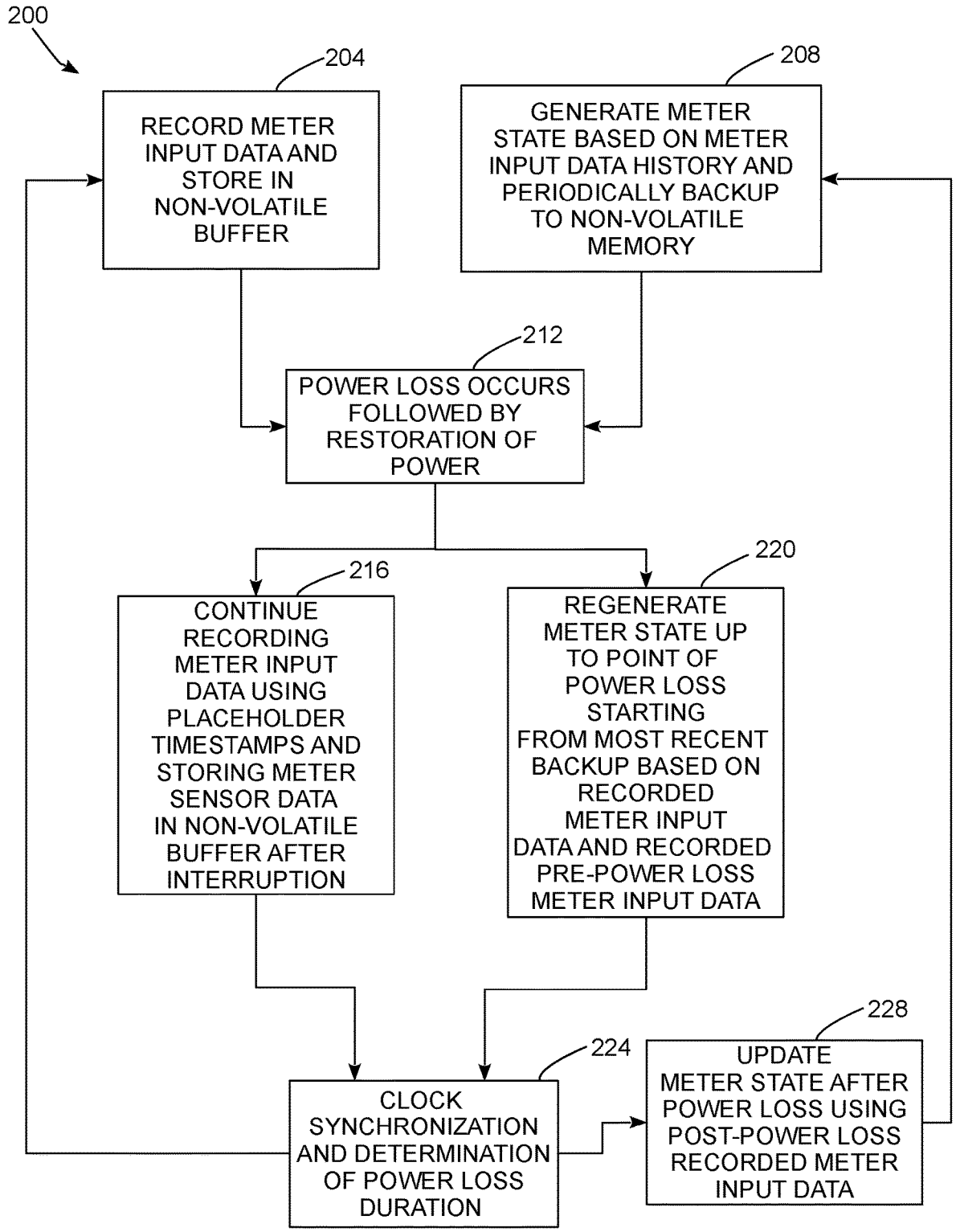
FIG. 2 is a block diagram of a process for operating the electric meter of FIG. 1 to handle interruptions in operation of the electric meter without requiring an uninterruptable power supply.

FIG. 2 depicts a process 200 for operation of an electric meter to reduce or eliminate the loss of data that occurs due to a power loss event without requiring the use of a UPS. In the description below, a reference to the process 200 performing a function or action refers to the operation of a processor device to executed stored program instructions to execute the function or action in conjunction with other components in an electric meter. The process 200 is described in conjunction with the meter 100 of FIG. 1 and the illustrative time diagram 300 of FIG. 3 for illustrative purposes.

During the process 200, the electric meter 100 receives meter input data at a predetermined time interval (e.g. one meter input data sample per second) and stores each sample of the meter input data in the non-volatile meter input data buffer 186 at the same or similar time interval at which the meter input data are received (block 204). In the illustrative embodiment of FIG. 1, the meter sensors 154 generate electrical current and voltage measurements corresponding to the electrical current that flows between the terminals 108A and 108B. The processor 180 receives the digitized meter sensor data from the DSP 158 and, amongst other processing operations, stores the sensors data in the non-volatile meter input data buffer 186 with as little delay as is practical given the hardware capabilities of the electric meter 100. In a practical embodiment of the electric meter 100 that uses an embedded processor 180 and a solid state non-volatile storage device, the processor 108 can store each set of meter sensor data within 100 milliseconds of receiving the data from the DSP 158 or other meter input data via the input bus 164. Since the DSP 158 generates a new sample of the meter input data every second, the processor 180 stores each new sample in the non-volatile memory buffer 186 at one second intervals. The processor 180 uses the RTC to generate precise timestamps for each sample of meter input data, and the processor 180 stores the timestamp in association with the meter input data in the non-volatile meter input data buffer 186.

Figure 4:
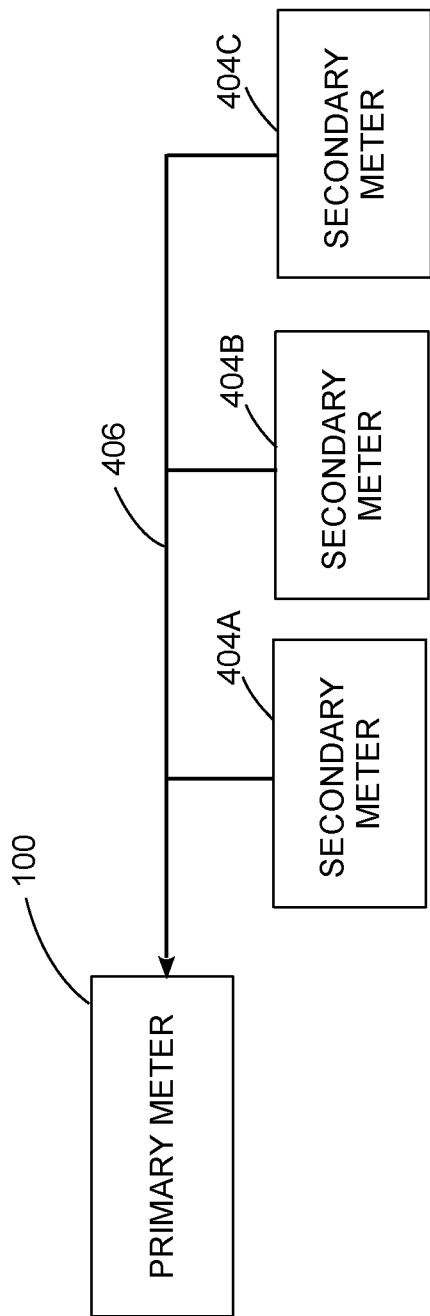
FIG. 4 is a diagram depicting multiple electric meters including a primary electric meter that receives meter input data from one or more secondary electric meters.

As described above, the meter input data also include meter input data that are received from the secondary meter network device 166 from one or more additional meters. FIG. 4 depicts an example of an electric meter network in which the electric meter 100 is a primary electric meter that receives meter sensor data and optionally other meter input data from three secondary meters 404A-404C. The electric meters 100 and 404A-404C communicate via a channel 406 that can be, for example, a wired communication network or a wireless communication channel. In one embodiment, the electric meter 100 also receives meter input data from the secondary meters 404A-404C at one second intervals to minimize the potential amount of data loss that can occur in the event of power loss in the electric meter 100 or in one or more of the electric meters 404A-404C. The memory 182 includes a single instance of the meter input data buffer 186 that stores the meter input data received from each of the additional electric meters 404A-404C that transmit meter input data to the electric meter 100. FIG. 4 depicts a total of four electric meters for illustrative purposes, but other embodiments can include a different number of secondary meters. Additionally, the electric meter 100 can perform the process 200 without receiving additional meter input data from any other electric meter.

In the embodiment of FIG. 1, the non-volatile meter input data buffer 186 is implemented as a ring buffer that stores a fixed number of samples of the sensor data and other meter input data corresponding to a predetermined period of time during operation of the electric meter 100. In one configuration, the non-volatile meter input data buffer 186 stores the most recent 30 minutes of meter input data, which corresponds to 1,800 samples given the sensor sample generation rate of one sample per second. After the data buffer 186 fills, the processor 180 overwrites the oldest entry in the data buffer to maintain a constant record of the previous 30 minutes of sampled meter input data in the non-volatile memory device. Each meter input data sample that is stored in the meter input data buffer 186 is associated with a timestamp corresponding to the time at which the meter input data sample was generated. In embodiments of the electric meter that receive meter input data from additional electric meters via the secondary meter network device 166, the memory 182 includes an additional non-volatile meter input data buffer 186 for each of the additional electric meters that transmits the meter input data to the electric meter 100. The electric meter 100 also uses copies of the meter input data that are stored in the volatile memory for additional processing to update the meter state data of the electric meter 100 and for reporting via the data output interface 162.

During the process 200 the processor 180 also receives meter input data from the relay sensors 168. In the embodiment of the electric meter 100, the processor 180 receives the relay state data corresponding to the actual state (opened or closed) of one or more external relays at one second intervals as part of the meter input data. Additionally, in embodiments that use KYZ pulses, the relay data includes the state of the Y and Z relays in each input meter data sample to track the duration of the pulses and the energy usage of the load over time. The processor 180 stores the relay state data with the other meter input data samples in the non-volatile meter input data buffer 186.

During the process 200, the electric meter 100 also generates and continually updates the meter state based on the meter input data while performing periodic backups of the meter state data to the non-volatile memory 188 at predetermined time intervals (block 208). As described above, the processor 180 generates and updates the meter state data based on multiple samples of the meter input data that are recorded over time. For embodiments of the electric meter 100 that record meter input data from one or more additional electric meters via secondary meter network device 166, the processor 180 also generates the meter state data including the meter input data samples that are received from each of the monitored electric meters to generate a single set of meter state data that corresponds to the aggregate of meter input data received from all of the electric meters in the networked configuration of FIG. 4. The meter state data typically occupy a larger amount of memory (e.g. tens of kilobytes of memory) compared to each sample of meter input data that typically only occupies on the order of several hundred bytes (e.g. 512 bytes) to a few kilobytes data. As such, in the electric meter 100 the processor 180 generally stores the meter state data in the volatile RAM 190 during normal operation and stores a backup copy of the meter state data to the meter state backup data 188 at comparatively long time intervals to reduce the overall requirements for non-volatile memory. In one embodiment, the meter 100 stores a backup of the meter state data at 15 minute intervals, and as described above the non-volatile meter input data buffer 186 stores the most recent 30 minutes of recorded sensor data at the much shorter one second intervals that correspond to the sampling rate of the meter input data.

Other meter embodiments can perform backups of the meter state data to non-volatile memory at longer or shorter time intervals and store longer or shorter buffers of meter input data. In general, the electric meter stores meter input data in the meter input data buffer 186 covering a longer time than the time period between backups of the meter state 188. For example, a meter input data buffer 186 that stores 120 minutes of meter input data is used in a configuration that stores the meter state data to the non-volatile meter state data backup data 188 every 2 minutes. Additionally, the system 100 stores more than one copy of the meter state data in the meter state data backup data 188 corresponding to two or more time intervals. In the embodiment of FIG. 1, the system 100 stores a total of thirty copies of the meter state data at two-minute intervals (covering sixty minutes) in the non-volatile meter state data backup data 188. In other embodiments, a non-volatile memory device stores at least two copies of the meter state data 188 corresponding to the two most recent time intervals to ensure that at least one valid backup copy of the meter state data 188 is stored in the non-volatile memory device. Storing at least two copies of the meter state data ensures that at least one valid copy of previously stored meter state data 188 is available in case the power loss occurs while the electric meter 100 is in the process of writing a new backup copy of the meter state data 188 because the power loss typically corrupts the meter state data that have not been completely written to the non-volatile memory device prior to the power loss. These examples employ a storage size of the meter input data buffer 186 that covers a length of time that is at least twice the length of the time interval between backups of the meter state data 188 to ensure that the meter input data buffer 186 stores, at a minimum, sufficient meter input data to regenerate the meter state data in a replay process starting from the oldest valid backup copy of the meter state data to regenerate the meter state after a power loss event. However, alternative embodiments can use a larger ratio between the time period stored in the meter input data buffer 186 and the period between backup storage of the meter state data to the non-volatile meter state backup 188.

Figure 3:
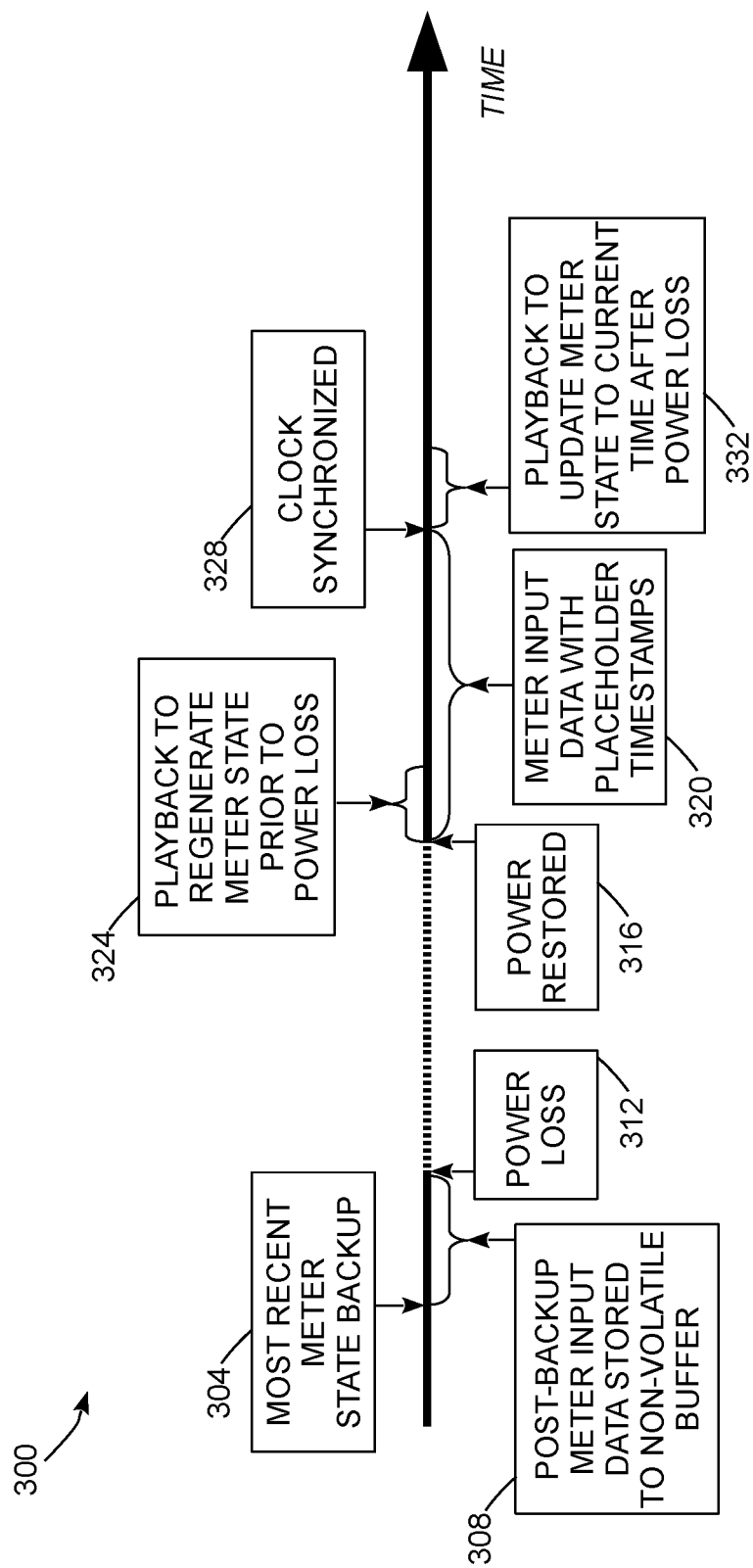
FIG. 3 is a time diagram that depicts an example of operation of the electric meter of FIG. 1 during the process of FIG. 2.

As depicted in FIG. 3, the timing diagram 300 depicts the operation of the electric meter 100 to perform the meter state backup 304 in which the processor 180 writes the meter state to the non-volatile meter state data backup 188. The electric meter 100 continues to store additional post-backup meter input data to the non-volatile meter sensor buffer 186 as depicted in the time region 308.

Referring again to FIG. 2, the electric meter 100 continues operation as described above with reference to the processing of blocks 204 and 208 until a power loss occurs (block 212). In the context of the process 200, the power loss occurs at an unexpected time that causes a loss of all data held in the volatile memory of the electric meter 100. The power loss prevents the processor 180 and other components in the electric meter from operating. Data within the volatile memory devices 190 that store sensor data and the meter state are lost after the power loss occurs although the contents of the non-volatile devices of the memory 182 remain intact and are accessible after power is restored. In particular, the meter input data buffer 186 and the most recent backup of the meter state data 188 are stored in the non-volatile memory and are available after the restoration of electrical power.

Upon restoration of electrical power, the electric meter 100 resumes monitoring of the electrical current that flows through the power line 116 (block 216). The meter sensors 154 generate sensor data and the DSP 158 provides the data to the processor 180 within a comparatively short time period (e.g. less than 10 seconds) of the restoration of electrical power. Additionally, the processor 180 receives additional meter input data from the secondary meter network device 166 and the relay sensors 168 via the input bus 164. In combination with the stored sensor data and other meter input data in the meter input data buffer 186, the electric meter 100 loses one second, at most, of recorded meter input data in the embodiment of FIG. 1 because the meter 100 stores each sample of meter input data to the non-volatile meter input data buffer 186 within one second of generating the meter input data. Other embodiments that record and store the meter input data at different intervals can lose recorded meter input data corresponding to a different time period, such as several seconds of data for electric meters that store samples of meter input data at a lower rate than the electric meter 100, due to the power loss.

However, upon initial restart the electric meter 100 cannot produce accurate timestamp information since the RTC resets upon power loss. In one embodiment, the processor 180 generates relative timestamp information starting from the first meter data sample that is generated after the electric meter 100 resumes operation with a data flag that indicates that the meter input data samples are not stored with normal timestamps. The relative timestamps are also referred to as "placeholder" timestamps since the processor 180 uses the placeholder timestamps until resynchronization of the RTC as is described below. The processor 180 also stores the meter input data that are generated after the electric meter 100 resumes operation in the meter input data buffer 186 in a similar manner to the processing described above with reference to block 204.

During the process 200, the electric meter 100 also regenerates the meter state at the time immediately prior to the power loss upon restoration of power to the electric meter (block 220). To regenerate the meter state, the processor 180 first retrieves the most recent backup of the meter state from the non-volatile meter state data 188 into the volatile memory 190. The processor 180 identifies the timestamp that is associated with the backup copy of the meter state and then regenerates the meter state at an earlier time (e.g. the time of the power loss) in a "playback" operation. The retrieved meter input data samples form a temporal sequence starting from the sample with the timestamp that occurs immediately after the backup of the meter state data until final sample of meter input data stored in the non-volatile buffer 186, which is recorded in the non-volatile memory device prior to the power loss.

The system 100 implements the playback of the previously stored meter input data to update the meter state only if the previously stored meter input data were generated using a properly synchronized RTC. In situations in which the system 100 experiences a sequence of power losses with brief periods of power restoration that do not permit full resynchronization of the RTC, the system 100 performs a playback using the most recent copy of the backup meter state data 188 and stored meter input data from the buffer 186 that were generated with properly synchronized RTC timestamps. In some embodiments, the electric meter 100 applies a default billing rate, which is also referred to as a "Standby Rate" to meter input data samples that were collected during brief periods of operation between power losses during which the electric meter 100 was unable to resynchronize the RTC and calculate precise billing information for the meter input data samples.

The processor 180 regenerates the meter state using the same sequence of operations that the processor 180 uses the update the meter state during normal operation. In one example, the processor 180 retrieves the most recent backup of the meter state data 188 with a timestamp of 12:00:00 in a situation in which the power loss occurred at 12:04:41. The processor 180 identifies the time of the power loss by searching the meter input data buffer 186 to identify each record of stored meter input data starting from 12:00:00 until the most recently stored record at 12:04:41 that occurred immediately prior to the power loss. The processor 180 uses each of the 281 meter input data records in the meter input data buffer 186, which correspond to one record per second for the 4:41 (281 seconds) elapsed from the most recent backup until the loss of power to regenerate the meter state data up to the time of the power loss event. The playback process enables the electric meter 100 to regenerate the same meter state data that was stored in the volatile memory 190 based on the most recently stored meter input data in the buffer 186 prior to the power loss, including energy usage and billing information that the meter 100 generated up to the time of the power loss. Additionally, in embodiments of the electric meter 100 that receive relay state data from the relay sensors 168 for external relays that provide load shedding, the processor 180 regenerates the meter state data based on the playback of the meter input data samples in the non-volatile meter input data buffer 186 to ensure that the meter state accurately reflects the history of how long each relay has been opened and closed different time periods in the meter input data. The recorded history of the opened or closed states of the relays can affect the billing information in the regenerated meter state data for specific loads that are connected to different relays for different durations in a time-of-use billing configuration. In some embodiments, the processor 180 also operates one or more relays to return the relays to a pre-power loss state if the relays are in different opened/closed states following the power loss compared to their states before the power loss.

As depicted in FIG. 3, the timing diagram 300 depicts the power loss event starting at time reference 312 when power is lost and ending at time reference 316 when power is restored. Once power is restored, the electric meter 100 resumes generating the sensor measurement data and other input meter data with the placeholder timestamps as depicted in the time region 320 and concurrently performs the playback operation to regenerate the meter state in the time region 324 based on the most recent meter state backup 304 until the final meter input data sample that was stored in the non-volatile memory immediately prior to the power loss. In particular, the processor 180 can perform the playback operation to regenerate the meter state data using all of the post-backup meter input data samples 308 to regenerate the state data of the electric meter 100 immediately prior to the power loss at time 312. The processor 180 continues to record meter input data generated by the DSP 158 and any other meter input data received via the input bus 164 after the restoration of power 316 using placeholder time stamps during the time period 320 prior to the synchronization of the RTC at time 328.

In an embodiment of the electric meter 100 that records meter input data from other electric meters using the secondary meter network device 166, the processor 180 also regenerates the meter state up to the time of the power loss event based on the meter input data that has been received from the additional monitored electric meters, such as the meters 404A-404C of FIG. 4, using the same process that is described above. Additionally, the electric meter 100 receives post power-loss meter input data from the secondary meters using the secondary meter network device 166 and the secondary electric meters either assign placeholder time stamps to the additional meter input data samples or the processor 180 assigns placeholder time stamps prior to resynchronization of the RTC. In situations in which the electric meter 100 loses power but one or more of the additional secondary electric meters 404A-404C do not lose power, the secondary electric meters that did not lose power can retransmit all of the meter input data that were generated during the power loss event to ensure that the electric meter 100 accurately regenerates the meter state for each of the secondary electric meters.

Referring again to FIG. 2, during the process 200, the processor 180 continues to use the placeholder timestamps for the meter input data until the electric meter 100 completes a clock synchronization process that sets the RTC in the processor 180 to the correct time (block 224). In the electric meter 100, the processor 180 receives the clock synchronization data from an external time source. Examples of processes to synchronize the RTC include for example, the network time protocol (NTP), a time synchronization message used in a SCADA system protocol such as the Distributed Network Protocol (DNP), or using a radio receiver that can receive time synchronization signals from various transmission sources including national radio time transmission services, cellular telephone transmission towers, navigation satellites including Global Positioning System (GPS) satellites, and the like. In some embodiments, the source of the RTC synchronization data is another electric meter (e.g. one of the secondary electric meters 404A-404C in the embodiment of FIG. 4) that either does not experience the power loss event or that has previously performed a time synchronization operation following the power loss event. Some electric meter embodiments also provide a manual interface for synchronizing the RTC.

In the illustrative embodiment of FIG. 2, the processor 180 determines the duration of the power loss event based on the difference between the final timestamp of meter input data that was generated prior to the power loss event and a calculated timestamp of the first sample of meter data after the resynchronization of the RTC. As described above, the electric meter 100 stores each meter input data sample in association with a placeholder timestamp. Upon resynchronization, the processor 180 calculates the actual time of the first placeholder timestamp based on the time period that elapsed after the electric meter 100 resumed operation following the power loss until the RTC was resynchronized. For example, if the electric meter 100 resynchronizes the RTC to a time (13:20:00) after collecting 300 seconds of meter input data using the placeholder timestamps, then the processor 180 calculates the time of power restoration as 13:15:00 (300 seconds prior to the current time). The processor 180 identifies the duration of the power loss event based on the difference between the time at which operation resumed and the final valid timestamp that is associated with a meter input data sample prior to the power loss (e.g. a 600 second power loss event starting just after 13:05:00 and lasting until 13:15:00). In situations in which the electric meter 100 experiences a series of power losses with only brief periods of operation between the power losses that do not enable resynchronization of the RTC, the electric meter 100 measures the duration of the power loss event as the entire time that elapses from prior to the first power loss until power is restored for enough time to enable the electric meter 100 to resynchronize the RTC. The electric meter 100 transmits the duration of the power loss event in addition to other meter state data to an external monitoring system using the data output devices 162.

The process 200 continues as the processor 180 performs another playback process to update the meter state data for the time period after the electric meter 100 resumes operation based on the meter input data stored in the meter input data buffer 186 after the restoration of power to the meter 100 following the power loss (block 228). In the meter 100, the processor 180 performs the second playback operation after the RTC has been resynchronized to ensure that the meter state is properly updated to the current time using the correct timestamp information for each sample of the meter input data. One non-limiting example of a meter state update operation that relies upon the correct absolute time from the RTC is the generation of the billing information based on the meter input data in situations where the billing rate for electricity changes between multiple tariff periods during a day or other time period. The processor 180 uses the synchronized RTC and the placeholder timestamps in the meter input data to calculate timestamps for each of the post-power loss meter input data samples during the second playback process based on the synchronized RTC and the relative placeholder timestamp of each meter input data sample. As depicted in FIG. 3, the processor 180 performs the second playback operation 332 after the clock synchronization 328 using the additional meter input data 320 that the meter records after the restoration of power at time 316. After the second playback process the electric meter 100 has generated an updated meter state that has lost at most one second of recorded meter input data due to the power loss event. After completion of the second playback process, the electric meter 100 resumes the operation as described above with reference to the processing of blocks 204 and 208. This includes continued operation to store additional meter input data with correct RTC timestamps in the non-volatile meter input data buffer 186 and to store backups of the meter state data at predetermined intervals in the non-volatile meter state backup data 188.

As described above, the embodiments described herein provide specific improvements to electric meters, including the non-limiting list of improvements described below. One improvement is an embodiment of an electric meter that reduces or eliminates the loss of meter input data and meter state data due to an unexpected power loss. Another improvement is that the electric meter reduces or eliminates the loss of meter input data and meter state data due to an unexpected power loss without requiring the use of a UPS or other battery/capacitor energy storage device in the electric meter. Yet another improvement includes the ability to operate the electric meter 100 for an extended period of time without the loss of recorded data fidelity due to the playback process that enables the electric meter to regenerate the meter state based on meter input data that are recorded in the non-volatile memory after the RTC clock is synchronized and the electric meter 100 can compute time values for each of the recorded meter input data samples. As described above, in one embodiment the non-volatile meter input data buffer 186 stores the meter input data for a prolonged period, such as up to two hours prior to resynchronization of the RTC, while only losing up to one second of recorded meter input data due to power loss. Thus, the electric meters described herein operate with little or no loss of data fidelity and can avoid operating in reduced-accuracy "standby" modes even when the electric meter experiences power loss events.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. An electric meter comprising:
a memory, the memory comprising at least one volatile memory device and at least one non-volatile memory device; and
a processor operatively connected to the memory, the processor being configured to:
retrieve a backup copy of meter state data from the at least one non-volatile memory device after the electric meter resumes operation following a power loss wherein meter state data represents state information generated by processing meter input data samples and the backup copy of meter state data was stored in the at least one non-volatile memory device based on a periodic backup schedule;
retrieve a first plurality of meter input data samples from the at least one non-volatile memory device after the electric meter resumes operation following the power loss, the first plurality of meter input data samples being associated with a time period after the backup copy of meter state data was stored in the at least one non-volatile memory device and prior to the power loss; and
regenerate meter state data after the electric meter resumes operation following the power loss, by updating the backup copy of meter state data with updated state information by processing the first plurality of meter input data samples to regenerate the meter state data at a time of a final meter input data sample in the first plurality of meter input data samples prior to the power loss, the regenerated meter state data being stored in the at least one volatile memory device.

2. The electric meter of claim 1, further comprising:
at least one meter sensor;
a digital signal processor (DSP) operatively connected to the at least one meter sensor and configured to generate meter input data samples based on signals received from the at least one meter sensor, the DSP being further configured to:
generate a first meter input data sample after the electric meter resumes operation following the power loss; and
the processor being operatively connected to the DSP and further configured to:
receive the first meter input data sample; and
store the first meter input data sample in a meter input data buffer in the at least one non-volatile memory device.

3. The electric meter of claim 2, the DSP being further configured to:
continue to generate a second plurality of meter input data samples based on signals received from the at least one meter sensor after the electric meter resumes operation following the power loss; and
the processor being further configured to store the second plurality of meter input data samples in the meter input data buffer in the at least one non-volatile memory device.

4. The electric meter of claim 2, the processor being further configured to:
store the first meter input data sample in the at least one non-volatile memory device in association with a placeholder timestamp prior to synchronization of a clock in the electric meter.

5. The electric meter of claim 4, the processor being further configured to:
synchronize the clock with an external time source after the electric meter resumes operation following the power loss; and
update the meter state data using the first meter input data sample with a time of the first meter input data sample being identified based on the synchronized clock.

6. The electric meter of claim 5, the DSP being further configured to:
continue to generate a second plurality of meter input data samples based on signals received from the at least one meter sensor after the synchronization of the clock; and
the processor being further configured to:
store the second plurality of meter input data samples in the meter input data buffer in the at least one non-volatile memory device;

generate updated meter state data based on the second plurality of meter input data samples; and store a backup copy of the updated meter state data to the at least one non-volatile memory device.

7. The electric meter of claim 2, the at least one meter sensor further comprising:
a current sensor configured to measure an electrical current of a power line; and
a voltage sensor configured to measure an electrical voltage in the power line.

8. The electric meter of claim 2, wherein the DSP is integrated into the processor.

9. The electric meter of claim 1 further comprising:
a relay sensor configured to detect an opened or closed state of a relay connected to the electric meter; and
the processor being operatively connected to the relay sensor and further configured to:
receive relay sensor data indicating an opened or closed state of the relay in each sample of the first plurality of meter input data samples; and
regenerate the meter state data based on the opened or closed state of the relay in the first plurality of meter input samples retrieved from the at least one non-volatile memory device.

10. The electric meter of claim 1 further comprising:
a network device configured to receive meter input data from a secondary electric meter that is external to the electric meter; and
the processor being operatively connected to the network device and further configured to:
receive at least one meter input data sample from the secondary electric meter using a network;
store the at least one meter input data sample in the at least one non-volatile memory device prior to the power loss; and
regenerate the meter state data by updating the backup copy of meter state data with the at least one meter input data sample received from the secondary electric meter via the network device.

11. A method of operating an electric meter comprising:
retrieving, with a processor in the electric meter, a backup copy of meter state data from at least one non-volatile memory device in the electric meter after the electric meter resumes operation following a power loss, wherein meter state data represents state information generated by processing meter input data samples and the backup copy of meter state data was stored in the at least one non-volatile memory device based on a periodic backup schedule;
retrieving, with the processor, a first plurality of meter input data samples from the at least one non-volatile memory device after the electric meter resumes operation following the power loss, the first plurality of meter input data samples being associated with a time period after the backup copy of meter state data was stored in the at least one non-volatile memory device and prior to the power loss; and
regenerating, with the processor, meter state data after the electric meter resumes operation following the power loss, by updating the backup copy of meter state data with updated state information by processing the first plurality of meter input data samples to regenerate the meter state data at a time of a final meter input data sample in the first plurality of meter input data samples prior to the power loss, the regenerated meter state data being stored in at least one volatile memory device in the electric meter.

12. The method of claim 11 further comprising:
generating, with a digital signal processor (DSP) operatively connected to at least one meter sensor in the electric meter, a first meter input data sample after the electric meter resumes operation following the power loss;
receiving, with the processor, the first meter input data sample; and
storing, with the processor, the first meter input data sample in a meter input data buffer in the at least one non-volatile memory device.

13. The method of claim 12 further comprising:
continuing to generate, with the DSP, a second plurality of meter input data samples based on signals received from the at least one meter sensor after the electric meter resumes operation following the power loss; and
storing, with the processor, the second plurality of meter input data samples in the meter input data buffer in the at least one non-volatile memory device.

14. The method of claim 12 further comprising:
storing, with the processor, the first meter input data sample in the at least one non-volatile memory device in association with a placeholder timestamp prior to synchronization of a clock in the electric meter.

15. The method of claim 14 further comprising:
synchronizing the clock with an external time source after the electric meter resumes operation following the power loss; and
updating, with the processor, the meter state data using the first meter input data sample with a time of the first meter input data sample being identified based on the synchronized clock.

16. The method of claim 15 further comprising:
continuing to generate, with the DSP, a second plurality of meter input data samples based on signals received from the at least one meter sensor after the synchronization of the clock;
storing, with the processor, the second plurality of meter input data samples in the meter input data buffer in the at least one non-volatile memory device;
generating, with the processor, updated meter state data based on the second plurality of meter input data samples and the meter state data; and
storing, with the processor, a backup copy of the updated meter state data to the at least one non-volatile memory device.

17. The method of claim 12 further comprising:
generating, with the DSP, the first meter input data sample based on a measurement of an electrical current of a power line received from a current sensor in the electric meter and a measurement of an electrical voltage in the power line received from a voltage sensor in the electric meter.

18. The method of claim 11 further comprising:
receiving, with the processor, relay sensor data from a relay sensor in the electric meter indicating an opened or closed state of a relay in each sample of the first plurality of meter input data samples; and
regenerating, with the processor, the meter state data based on the opened or closed state of the relay in the first plurality of meter input samples retrieved from the at least one non-volatile memory device.

19. The method of claim 11 further comprising:
receiving, with the processor, at least one meter input data sample using a network device in the electric meter that receives the at least one meter input data sample from a secondary electric meter that is external to the electric meter;

storing, with the processor, the at least one meter input data sample in the at least one non-volatile memory device prior to the power loss; and regenerating, with the processor, the meter state data by updating the backup copy of meter state data with the at least one meter input data sample received from the secondary electric meter via the network device.

* * * * *